United States Patent
Schindler (10) Patent No.: US 8,324,944 B2
(45) Date of Patent: Dec. 4, 2012

(54) STARTUP CIRCUITRY AND CORRESPONDING METHOD FOR PROVIDING A STARTUP CORRECTION TO A MAIN CIRCUIT CONNECTED TO A STARTUP CIRCUITRY

(75) Inventor: Jaromir Schindler, Hranice n. M. (CZ)

(73) Assignee: STMicroelectronics Design and Application S.R.O., Praha (CZ)

( * ) Notice: Subject to any disclaimer, the term of this patent is extended or adjusted under 35 U.S.C. 154(b) by 261 days.

(21) Appl. No.: 12/787,285

(22) Filed: May 25, 2010

(65) Prior Publication Data

US 2010/0301909 A1 Dec. 2, 2010

(30) Foreign Application Priority Data

May 29, 2009 (IT) .............................. MI2009A0953

(51) Int. Cl.
*H03L 7/00* (2006.01)
(52) U.S. Cl. ...................................................... 327/143
(58) Field of Classification Search ........................ None
See application file for complete search history.

(56) References Cited

U.S. PATENT DOCUMENTS

| | | | |
|---|---|---|---|
| 5,041,802 A | 8/1991 | Wei et al. | |
| 5,867,013 A * | 2/1999 | Yu .................................. | 323/314 |
| 6,057,721 A | 5/2000 | Nolan et al. | |
| 6,084,388 A | 7/2000 | Toosky | |
| 6,160,392 A | 12/2000 | Shin | |
| 6,222,399 B1 | 4/2001 | Imbornone et al. | |
| 6,683,444 B2 | 1/2004 | Marie | |
| 6,784,652 B1 | 8/2004 | Aude | |

FOREIGN PATENT DOCUMENTS

| | | |
|---|---|---|
| EP | 1326155 A1 | 7/2003 |
| JP | 2000181554 A | 6/2000 |
| JP | 2002093032 A | 3/2002 |

* cited by examiner

*Primary Examiner* — Lincoln Donovan
*Assistant Examiner* — Daniel Rojas
(74) *Attorney, Agent, or Firm* — Seed IP Law Group PLLC (57) ABSTRACT

A startup circuitry connected to a main circuit which has at least an output terminal connected to its feedback terminal by a feedback loop. The startup circuitry is connected to the main circuit in such a manner to break the feedback loop, by having a first circuit node connected to said output terminal of said main circuit and a second circuit node connected to its feedback terminal, said startup circuitry providing a correct output voltage value during the startup phase of said main circuit.

28 Claims, 5 Drawing Sheets

STARTUP CIRCUITRY AND CORRESPONDING METHOD FOR PROVIDING A STARTUP CORRECTION TO A MAIN CIRCUIT CONNECTED TO A STARTUP CIRCUITRY

BACKGROUND

1. Technical Field

The present disclosure relates to a startup circuitry connected to a main circuit which has at least an output terminal connected to its feedback terminal by a feedback loop. The disclosure also relates to a method for providing a startup correction to a main circuit connected to a startup circuitry. The disclosure particularly, but not exclusively, relates to a startup circuitry for analog circuits, in particular of the low power type and the following description is made with reference to this field of application for convenience of explanation only.

2. Description of the Related Art

As it is well known, self biased circuits, in particular analog ones, need to have a so called startup circuitry able to fast reestablishing a working or operational state when the circuit are connected to a power supply or, in a general manner, when they are enabled to work.

In particular, circuits with an internal feedback loop, like bandgap reference circuits, DVgs/R reference circuits or current source circuits, which are used widely in nowadays analog integrated circuits, usually have more than one single desired operational status or point.

Therefore, in this field there is the need of ensuring that a circuit of this kind reaches a right DC operational point, in a safely and reasonably timely manner. This need is satisfied, as already indicated above, by adding a suitable startup circuitry to main circuit.

A startup circuitry is generally divided in two portions, namely a first or sensing portion that detects whether a main circuit connected to the startup circuit is in a desired operational point (OP) and suitably drives a second or active portion.

In particular, the active portion of the startup circuitry is configured to force the main circuit to a desired OP, while both the sensing and the active portions should not influence the main circuit when settled in the desired OP.

Figure 1A:
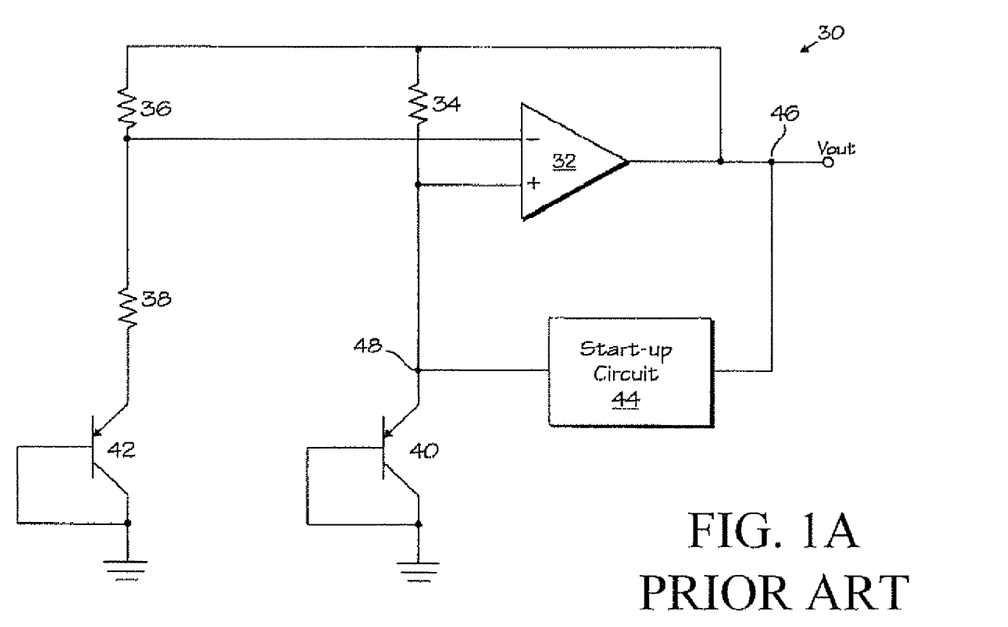
FIGS. 1A and 1B schematically show a startup circuitry for a bandgap reference circuit realized according to the prior art and the startup circuitry in greater detail, respectively.
Figure 1B:
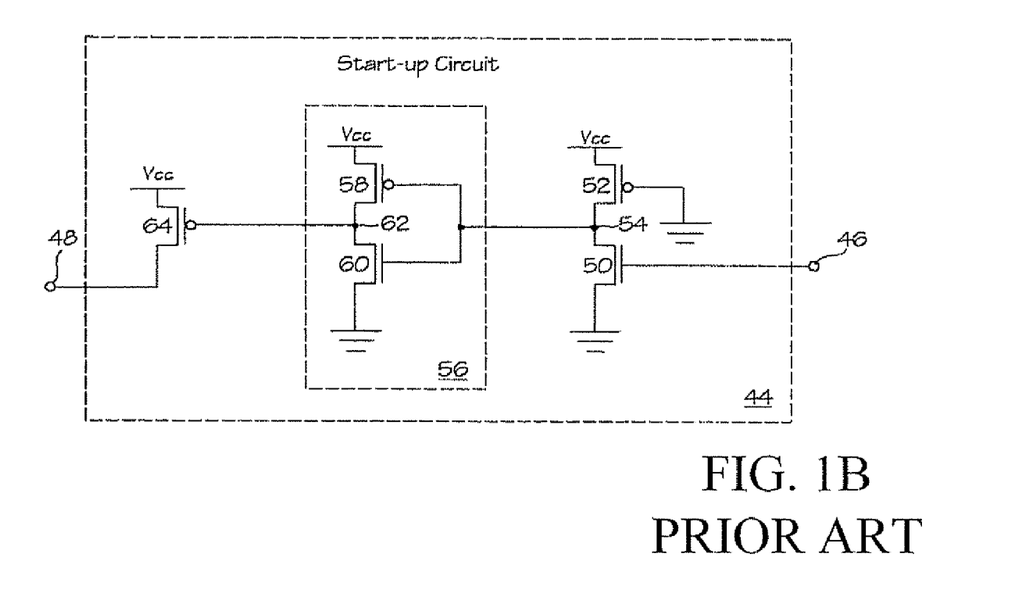

A startup circuit of a known type is shown for example in FIGS. 1A and 1B and described in the U.S. Pat. No. 5,867,013 issued on Feb. 2, 1999 in the name of CYPRESS SEMICONDUCTOR CORP. In particular, according to this known solution, the sensing of the OP of a band-gap reference circuit 30 is based on the voltage value Vgs of the NMOS transistor 50 which senses the output band-gap voltage Vout at the node 46. The signal so sensed is shaped and processed by the inverter 56 of the startup circuit 44. Moreover, the output signal from the inverter 56 is provided to an active portion of the startup circuitry 44 essentially comprising the PMOS transistor 64. This active portion forces, in case of a bad operational state of the band-gap reference circuit 30, a positive voltage value to the node 48.

Figure 2:
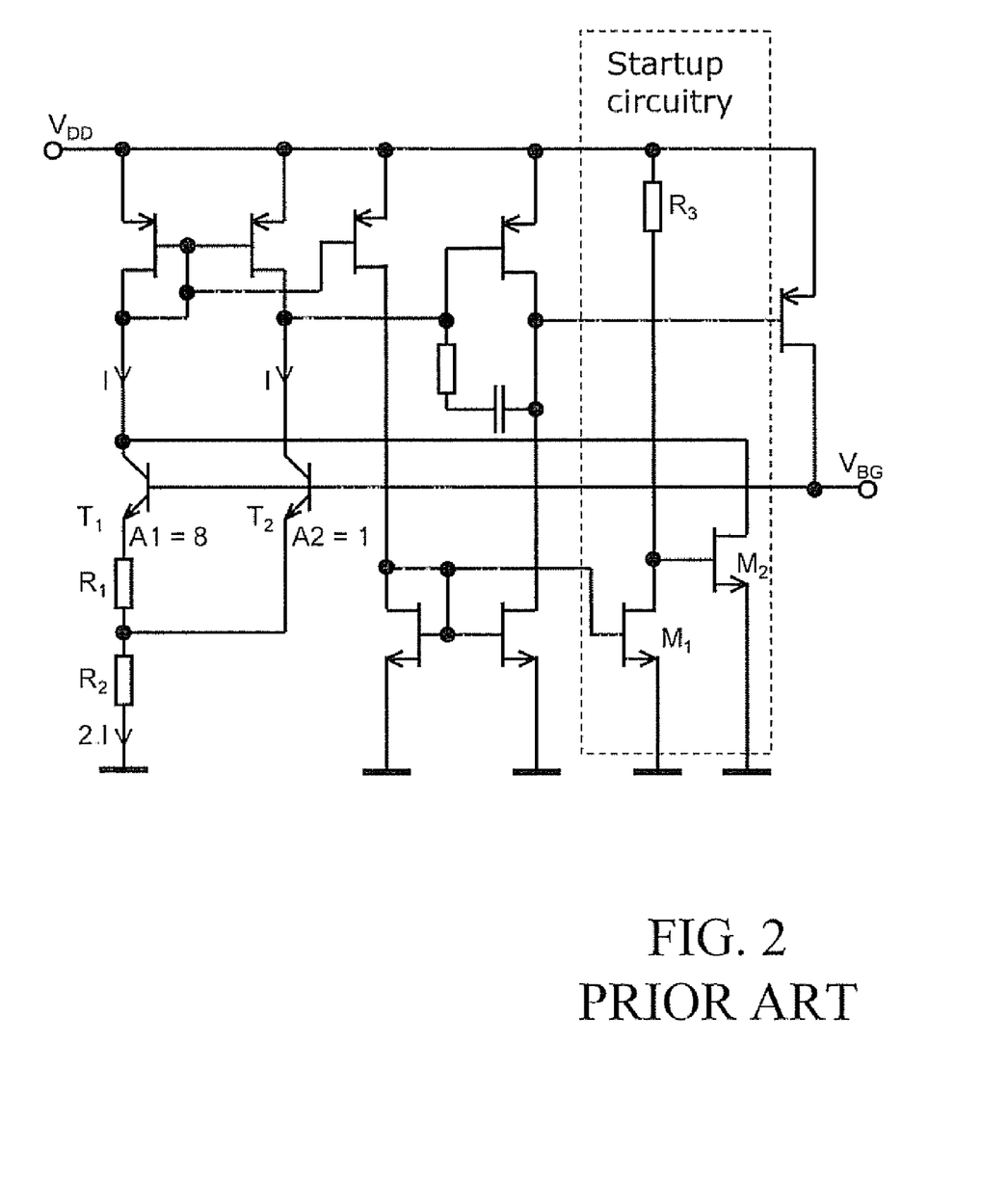
FIG. 2 schematically shows an alternative embodiment of a startup circuitry for a bandgap reference circuit realized according to the prior art.

Another known startup circuitry is shown in FIG. 2. In this case, a branch current rather than a node voltage is checked by the sensing part of the startup circuit to recognize the state of the main circuit, in particular a band-gap circuit. A sensing transistor M1 copies a current signal from the main circuit and compares it with the current supplied by the resistor R3. The active portion of the startup circuit essentially comprises the transistor M2. In case of a wrong OP (when there is no current through the main circuit branches) the transistor M2 starts to sink current and forces the band-gap circuit to the right OP.

The many different startup circuitries, which are known and widely used in analog circuit design, could be considered as alternative embodiments or improvements of the above described circuitries. Some of them are described for instance in the U.S. Pat. Nos. 6,160,392, 6,084,388, 6,222,399, 6,784,652 and 6,057,721.

BRIEF SUMMARY

In an embodiment, a startup circuitry is configured to break the feedback loop of a main circuit connected thereto and provide to an output terminal a correct voltage value during the startup phase of the main circuit.

In an embodiment, a startup circuitry connected to a main circuit which has at least an output terminal connected to its feedback terminal by a feedback loop characterized in that said startup circuitry is connected to the main circuit in such a manner to break the feedback loop, by having a first circuit node connected to said output terminal of said main circuit and a second circuit node connected to its feedback terminal, said startup circuitry providing a correct output voltage value during the startup phase of said main circuit.

According to an embodiment, the startup circuitry also comprises an auxiliary circuit which may be a functional a copy of said main circuit not suffering from the same startup variations and thus providing said correct output voltage value.

According to an embodiment, the startup circuitry further comprises a startup detection block connected to a sensing terminal of said main circuit and providing on a third circuit node an enabling signal corresponding to a state of said main circuit wherein a startup is needed.

According to an embodiment, the startup circuitry further comprises a switching block which is inserted between said first and second circuit node of said main circuit and is connected to a fourth circuit node of said auxiliary circuit providing said correct output voltage value as well to said third circuit node of said startup detection block, said enabling signal being used as a driving signal by said switching block in order to open said feedback loop of said main circuit.

According to an embodiment, the startup circuitry further comprises a compensation feedback impedance coupled between a fifth circuit node and a first voltage reference, said fifth circuit node being in turn connected to said first circuit node through said switching block in order to be connected to the main circuit when said feedback loop is open. In an embodiment, the switching block comprises a first and a second switch, both driven by said enabling signal provided by said startup detection block, wherein:

said first switch is coupled between said first circuit node and said fifth circuit node in a first operational state of the main circuit, and between said first circuit node and said second circuit node in a second operational phase of said main circuit, when said feedback loop is to be closed; and said second switch is coupled between said fourth circuit node and said second circuit node and is closed in said first operational state of said main circuit, when said feedback loop is to be opened, while it is open in said second operational phase of said main circuit, when said feedback loop is to be closed.

According to an embodiment, said auxiliary circuit is disconnected from a second voltage reference, in said second operational phase of said main circuit, when said feedback loop is closed.

In an embodiment, said main circuit comprises at least an output driver transistor which is coupled between said second voltage reference and said first circuit node and has a gate terminal connected to an internal circuit node and in said startup detection block is inserted between said first and second voltage references and in turn includes at least a detection transistor which is coupled between said second voltage reference and a detection condenser, in turn connected to said first voltage reference interconnected in correspondence with a detection node, said detection transistor having a gate terminal connected to said internal circuit node.

In an embodiment, said startup detection block further comprises a first and a second inverter which are inserted, in series to each other, between said detection node and a switching internal circuit node and interconnected in correspondence with said third circuit node.

In an embodiment, said switching block is inserted between said first and second circuit nodes and includes at least a first switching transistor being coupled, in series with a first current generator, between said first circuit node and said first voltage reference as well as a second switching transistor being also coupled, in series with a second current generator, between said first circuit node and said first voltage reference, said first current generator acting as said compensation feedback impedance. In an embodiment, said first switching transistor has a gate terminal connected to said third circuit node and said second switching transistor has a gate terminal connected to said switching internal circuit node and thus to said second inverter of said startup detection block.

In an embodiment, said auxiliary circuit is coupled between said first and second voltage references and is based on a same topology and on same types of components as said main circuit.

In an embodiment, said main circuit is a low power and low quiescent current bandgap circuit and said auxiliary circuit is a high power functional copy thereof having an output voltage value being highly and correctly correlated to said one of the bandgap main circuit and a quiescent current much higher than the one of said main bandgap circuit.

In an embodiment, a method for providing a startup correction to a main circuit connected to a startup circuitry comprises the steps of:
  detecting a startup state of said main circuit;
  providing a correct output voltage value corresponding to a voltage value of said main circuit at the end of said startup state;
  opening a feedback loop of said main circuit; and
  applying said correct output voltage value to an output terminal till the end of said startup state of said main circuit.

In an embodiment, said step of opening said feedback loop of said main circuit is performed by said startup circuitry which has a first circuit node connected to an output terminal of said main circuit and a second circuit node connected to its feedback terminal and comprises at least a switching block connected to an auxiliary circuit, which is a functional copy of said main circuit not suffering from the same startup variations, and to a startup detection block providing an enabling signal corresponding to a state of said main circuit wherein a startup is needed, said switching block being able to open said feedback loop.

In an embodiment, said step of applying said correct output voltage value is performed by said auxiliary circuit.

In an embodiment, the method further comprises a step of detecting the begin and the end of said startup state of said main circuit.

In an embodiment, said step of detecting is performed by said startup detection block.

In an embodiment, the method further comprises a step of disconnecting said correct output voltage value at the end of said startup state of said main circuit.

In an embodiment, said step of disconnecting is performed by said switching block.

In an embodiment, a device comprises: an input node configured to couple to an output of a circuit having a feedback input; a feedback output node configured to couple to the feedback input of the circuit; and a startup module configured to detect a startup condition of the circuit, and when a startup condition is detected, break a connection between the output node of the circuit and the feedback node of the circuit and provide a feedback output signal to the feedback node of the circuit. In an embodiment, when a startup condition is detected the startup module is further configured to couple the feedback output node to an output node of the device. In an embodiment, when a startup condition is not detected the startup module is configured to couple the output of the circuit to the feedback input of the circuit and to the output node of the device. In an embodiment, the device further comprises an auxiliary circuit which is a functional copy of said circuit and wherein the startup module is configured to couple an output of the auxiliary circuit to the feedback input of the circuit and to the output of the device. In an embodiment, the startup module is coupled to a sensing terminal of said circuit and is configured to provide an enabling signal corresponding to a state of said circuit wherein a startup condition is detected. In an embodiment, the startup module comprises a switching block which is configured to couple between the output of the circuit and the feedback input of the circuit and is configured to couple to the output of said auxiliary circuit as well to said enabling signal, the switching block being configured to use the enabling signal as a driving signal to break the connection between the output of the circuit and the feedback input of the circuit. In an embodiment, the device further comprises a compensation feedback impedance, wherein the switching block is configured to couple the output of the circuit to a first reference voltage through the compensation feedback impedance when the startup condition is detected. In an embodiment, said switching block comprises a first and a second switch, both driven by said enabling signal, wherein: said first switch is configured to couple the output of the circuit to the compensation feedback impedance in a first operational state of the circuit, and to coupled the output of the circuit to the feedback input of the circuit in a second operational phase of said circuit, when a feedback loop of the circuit is to be closed; and said second switch is configured to coupled between the output of the auxiliary circuit the feedback input of the circuit and is closed in said first operational state of the main circuit, and is open in said second operational phase of said circuit, when said feedback loop is to be closed. In an embodiment, said auxiliary circuit is disconnected from a second voltage reference, in said second operational phase of said circuit, when said feedback loop is closed. In an embodiment, said circuit comprises at least an output driver transistor which is coupled between said second voltage reference and said output of the circuit and has a gate terminal connected to an internal circuit node of the circuit and wherein the startup module is coupled between said first and second voltage references and in turn includes at least a detection transistor which is coupled between said second voltage reference and a detection condenser, in turn connected to said first voltage reference interconnected in correspondence with a detection node, said detection transistor having a gate terminal connected to said internal circuit node. In an embodiment, said startup module further comprises a first and a second inverter which are inserted, in series to each other, between said detection node and a switching internal circuit node and configured to provide the enabling signal at an interconnection between the first and second inverters. In an embodiment, the switching block includes at least a first switching transistor being coupled, in series with a first current generator, between said output of the circuit and said first voltage reference as well as a second switching transistor being also coupled in series with a second current generator, between said output of the circuit and said first voltage reference, said first current generator acting as said compensation feedback impedance. In an embodiment, said first switching transistor has a gate terminal connected to said enable signal and said second switching transistor has a gate terminal connected to said switching internal circuit node and thus to said second inverter of said startup detection block. In an embodiment, said circuit and said auxiliary circuit are coupled between first and second voltage references and the auxiliary circuit is based on a same topology and on same types of components as said circuit. In an embodiment, said circuit is a low power and low quiescent current bandgap main circuit and said auxiliary circuit is a high power copy thereof having an output voltage value being highly correlated to said output of the bandgap main circuit and a quiescent current much higher than the quiescent current of said bandgap main circuit.

In an embodiment, a method comprises: detecting a startup state of a main circuit; generating a startup output voltage value corresponding to a voltage value of said main circuit at the end of said startup state; opening a feedback loop of said main circuit; and applying said startup output voltage value to an output terminal until an end of said startup state of said main circuit. In an embodiment, said step of opening said feedback loop of said main circuit is performed by startup circuitry which has a first circuit node connected to an output terminal of said main circuit and a second circuit node connected to a feedback terminal of the main circuit and the startup circuitry comprises at least a switching block connected to an auxiliary circuit, which is a copy of said main circuit not suffering from a same startup variations as the main circuit, and to a startup detection block providing an enabling signal corresponding to a state of said main circuit wherein a startup is needed, said switching block configured to open said feedback loop. In an embodiment, said step of generating said startup output voltage value is performed by said auxiliary circuit. In an embodiment, the method further comprises a step of detecting a begin and the end of said startup state of said main circuit. In an embodiment, said step of detecting is performed by said startup detection block. In an embodiment, the method further comprises a step of disconnecting said startup output voltage value at the end of said startup state of said main circuit. In an embodiment, said step of disconnecting is performed by said switching block.

In an embodiment, a system comprises: a circuit configured to generate an output signal provided to an output node and having a feedback loop; means for detecting a startup state of the circuit; means for responding to detection of a startup state by interrupting the feedback loop and coupling an alternative output signal to the output node. In an embodiment, the system further comprises means for generating the alternative output signal. In an embodiment, the circuit is configured to operate at a first power level and the means for generating the alternative output signal is a circuit having a similar structure as the circuit configured to generate the output signal and is configured to operate at a second power level higher than the first power level. In an embodiment, the circuit configured to generate the output signal is a low power and low quiescent current bandgap main circuit and the means for generating the alternative output signal is a higher power copy thereof configured to generate a stable alternative output signal in response to detection of a startup faster than the current bandgap main circuit.

In an embodiment, an integrated circuit comprises: a first module configured to generate a first output signal and having a feedback input; a second module configured to generate a second output signal; and a startup module configured to: determine when the first module is in a startup mode; when the first module is in the startup mode, couple the second output signal to the feedback input of the first module; and when the first module is not in the startup mode, couple the first output signal to the feedback input of the first module. In an embodiment, the startup module is configured to: when the first module is in the startup mode, enable to second module and couple the second output signal to a node of the integrated circuit; and when the first module is not in the startup mode, disable the second module and couple the first output signal to the node of the integrated circuit. In an embodiment, the first module has a first configuration of components and is configured to draw power at a first power level and the second module has the first configuration of components and is configured to draw power at a second power level higher than the first power level.

The characteristics and advantages of some embodiments of the startup circuitry and of the method will be apparent from the following description of an embodiment thereof given by way of indicative and non limiting example with reference to the annexed drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, switching blocks and current generators, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

As already indicated, the prior art documents essentially relate to devices comprising the following portions:

1) a main circuit having internal loopback or feedback path and thus needing a startup circuitry;
2) a sensing portion of the startup circuitry; and
3) an active portion of the startup circuitry.

In particular it could be verified that the loopback path in the main circuit is usually connected all the working time, namely during a startup period as well as a during standard operation period.

Moreover, the sensing portion of a prior art startup circuitry controls the operational state of the main circuit by checking either one of the node voltage or a branch current of the main circuit. It can obviously include other features or modifications with respect to the simplified schemes as above described.

Also, the active portion of such known prior art startup circuitries, in particular during a start-up phase, affects the main circuit, which is a closed-loop one, by forcing a current to one or some of its branches. Thanks to this active portion, the main circuit is kicked out of the wrong state (in particular, usually corresponding to a zero current value) and thus the purpose of the startup circuitry achieved. However, on the other hand, the main circuit sometimes turns out to not be able to reach its steady operational state.

It should be also noted that some portions of the main circuit are made not operative (being short-circuited) during the startup phase and thus not biased at all.

Moreover, it should be remarked that the largely used loopback or feedback circuits are usually designed with a relatively high open-loop gain, the influence of the active portion of the startup circuitry on the operational point of the main circuit being thus enormous, the latter usually reaching a saturation state. The main circuit components and their parasitic capacitances are then either not biased at all or biased to a wrong level. This usually leads to a sudden increase in the output value above its nominal level, the so called output value overshoot, such an overshoot being usually not acceptable.

When the startup phase ends, the startup circuitry should no more influence the main circuit in such a way that it could search for its steady state. However, this transient event usually leads to a strong transient response wherein an output signal of the main circuit exhibits a non monotonic pattern with overshoots and ringing. In some cases, the main circuit may even fall back to the wrong zero state.

This issue can become critical in the low power circuits, wherein extremely small currents and usually huge parasitic capacitances create a big settling time.

From the above can be derived that, using a classical startup approach, the startup phase of a low power device turns out to be usually very slow, with a wide spread.

Moreover, as it is well known, in particular in the field of battery powered devices, the actual trend is to switch off all the circuit blocks which are not necessary in a particular moment and to switch them on in a really fast way when they become needed.

In essence, the shape of a startup curve should be smooth, overshoot-free and monotonic (without local extremes). Moreover, the turn on time is desired to be very fast (some us) and reliable, with a small spread.

It is however hard to meet this different and particular power management goals by using low power circuit when equipped with a startup circuitry of the known type.

The technical problem underlying the present disclosure is that of providing a startup circuitry for a main circuit in particular of the low power type having structural and functional characteristics which allow to overcome the limits which still affect the circuitries realized according to the prior art.

Figure 3:
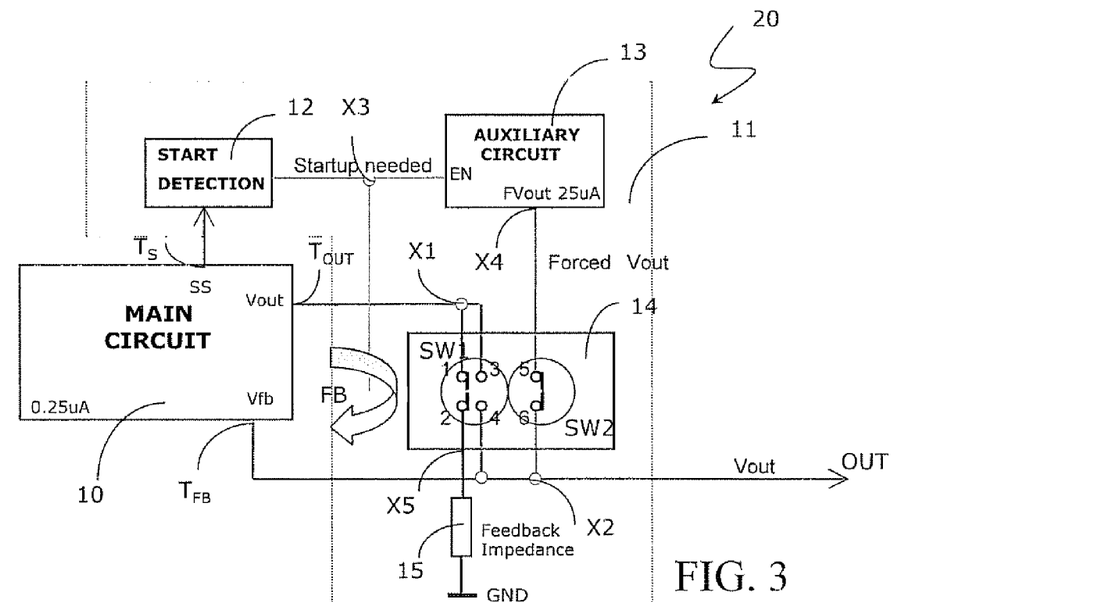
FIGS. 3 and 4 schematically show a main circuit connected to a startup circuitry realized according to an embodiment, in a start-up state and a steady operational state respectively.
Figure 4:
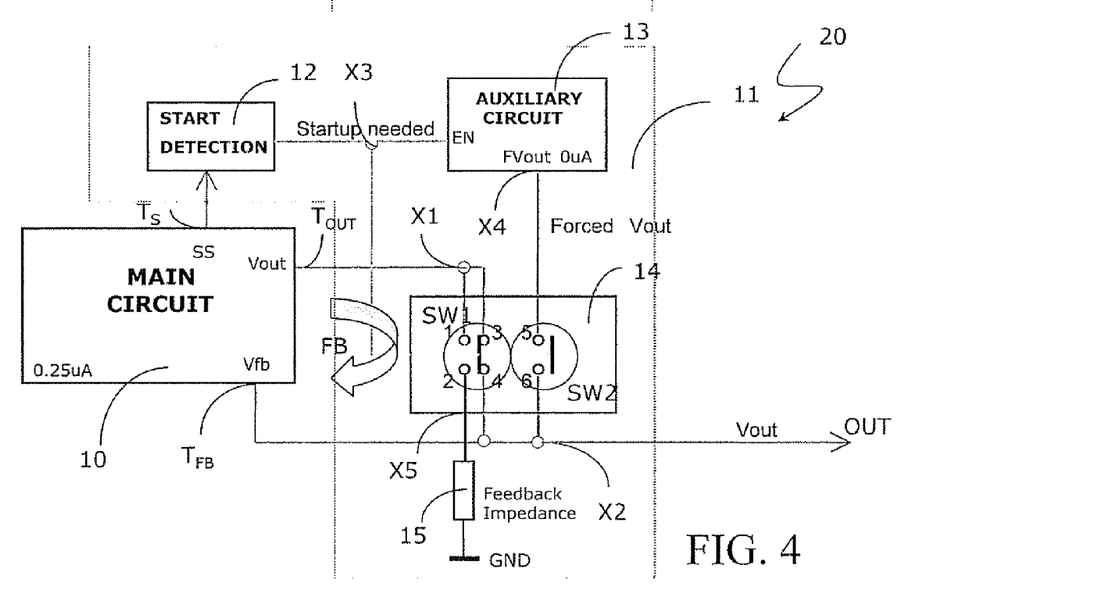

With reference to such figures, and in particular to FIGS. 3 and 4, a main circuit connected to a startup circuitry to realize a driven circuit 20 according to an embodiment is schematically shown.

A main circuit 10, for example a band gap circuit, has an output terminal $T_{OUT}$ connected to its feedback terminal $T_{FB}$ by a feedback loop FB.

A startup circuitry 11 is connected to the main circuit 10 in such a manner to break the feedback loop FB.

As illustrated, the startup circuitry 11 has a first circuit node X1 connected to the output terminal $T_{OUT}$ of the main circuit 10 and a second circuit node X2 connected to its feedback terminal $T_{FB}$ as well to an output terminal OUT of the driven circuit 20.

The startup circuitry 11 comprises a startup detection block 12 connected to a sensing terminal $T_S$ of the main circuit 10 and providing on a third circuit node X3 an enabling signal EN corresponding to a state of the main circuit 10 wherein a startup is needed.

The startup detection block 12 is in turn connected to an auxiliary circuit 13 connected to the third circuit node X3 and receiving from it the enabling signal EN and having a fourth circuit node X4 providing a forced output voltage value FVout to a switching block 14, in turn connected to the first circuit node X1 and to the second circuit node X2, as well to the third circuit node X3, the latter providing to the switching block 14 the enabling signal EN to be used as a driving signal.

In this way, the startup circuitry 11 breaks the feedback loop FB of the main circuit 10 and provides to the output terminal OUT of the driven circuit 20 a precise voltage value during the startup phase of the main circuit 10.

Such a precise voltage value is the forced output voltage value FVout and is obtained from the auxiliary circuit 13, which is a functional copy of the main circuit 10 not suffering from the same startup variations. In particular, being the main circuit 10 a low power circuit, the auxiliary circuit 13 may be a high power functional copy thereof having an output voltage value being highly and correctly correlated to the one of the main circuit 10. In this way, the output terminal OUT of the driven circuit 20 provides a correct voltage value.

Moreover, being the load impedance of the main circuit, namely the one tied to its output driver, changed by the breaking of the feedback loop FB performed by the startup circuitry 11 during a startup phase, as more clearly explained hereinafter, a compensation feedback impedance 15 is also provided into the startup circuitry 11, duly connected to the main circuit 10 when the feedback loop FB is open. As illustrated, the compensation feedback impedance 15 is coupled between a fifth circuit node X5 and a voltage reference, namely a ground GND, the fifth circuit node X5 being in turn connected to the first circuit node X1, and thus to the output terminal $T_{OUT}$ of the main circuit 10 through the switching block 14, which also provides for a connect coupling and decoupling of such a compensation feedback impedance 15 according to the state of the main circuit 10. In this way, all the components of the main circuit 10 are correctly set to their operational points also during the startup state of the main circuit 10, as in the steady state when the feedback loop FB is closed.

The switching block 14 essentially comprises a first and a second switch, SW1 and SW2, both driven by the enabling signal EN provided by the startup detection block 12.

The first switch SW1 is coupled between the first circuit node X1 and the fifth circuit node X5 in a first operational state, in particular a startup state, of the main circuit 10, as shown in FIG. 3, and between the first circuit node X1 and the second circuit node X2 in a second operational phase, in particular a steady state, of the main circuit 10, as shown in FIG. 4.

Moreover, the second switch SW2 is coupled between the fourth circuit node X4 and the second circuit node X2 and is closed in the first operational state, in particular the startup state, of the main circuit 10, as shown in FIG. 3, while it is open in the second operational phase, in particular the steady state, of the main circuit 10, as shown in FIG. 4.

When all the components of the main circuit 10 are correctly set to their nominal operational points, thanks to the forced output voltage value FVout provided by the auxiliary circuit 13, the feedback loop FB can be closed. At the same time, the compensation feedback impedance 15 is disconnected as well as the auxiliary circuit 13 by the switching block 14. From that time, the auxiliary circuit 13 is also disconnected from a power supply reference, not shown in FIGS. 3 and 4, so that there is no additional current consumption.

An embodiment also relates to a method for providing a startup correction in a driven circuit 20 comprising a main circuit 10 connected to a startup circuitry 11 comprising the steps of:

detecting a startup state of the main circuit 10;

providing a forced output voltage value FVout corresponding to a voltage value of the main circuit 10 at the end of the startup state;

breaking i.e., opening a feedback loop FB of the main circuit 10; and applying the forced output voltage value FVout to an output terminal of the driven circuit 20 till the end of the startup state of the main circuit 10.

In an embodiment, the step of opening the feedback loop FB of the main circuit 10 is performed by the startup circuitry 11 which has a first circuit node X1 connected to the output terminal $T_{OUT}$ of the main circuit 10 and a second circuit node X2 connected to its feedback terminal $T_{FB}$ and comprises at least a switching block 14 connected to an auxiliary circuit 13, which is a functional copy of the main circuit 10 not suffering from the same startup variations, and to a startup detection block 12 providing an enabling signal EN corresponding to a state of the main circuit 10 wherein a startup is needed, the switching block 14 being able to break, i.e., open the feedback loop FB.

In an embodiment, the step of applying the forced output voltage value FVout to the output terminal of the driven circuit 20 is performed by the auxiliary circuit 13.

In an embodiment, the method also comprises the step of detecting the begin and the end of the startup state of the main circuit 10.

The step of detecting the begin and the end of the startup state of the main circuit 10 is performed by the startup detection block 12 connected to the main circuit 10 and providing the enabling signal EN to the auxiliary circuit 13.

In an embodiment, the method comprises the step of disconnecting said forced output voltage value FVout at the end of the startup state of the main circuit 10.

With reference to FIGS. 3 and 4, the step of disconnecting the forced output voltage value FVout is performed by the switching block 14 connected to the auxiliary circuit 13 and to the startup detection block 12.

It should be emphasized that, in constrat with the known solutions as above described, the startup circuitry 11 interfaces with the main circuit 10 in a different manner, in particular in such a way to suitably break the feedback loop FB when the main circuit 10 is in the startup state. In this way, the working of the driven circuit 20 comprising the startup circuitry 11 is reliable, the settling time of the main circuit 10 is short and the output voltage value at the output terminal OUT is available even before the end of such a settling time, being an output value corresponding to the forced output voltage value FVout supplied from the auxiliary circuit 13.

Figure 5:
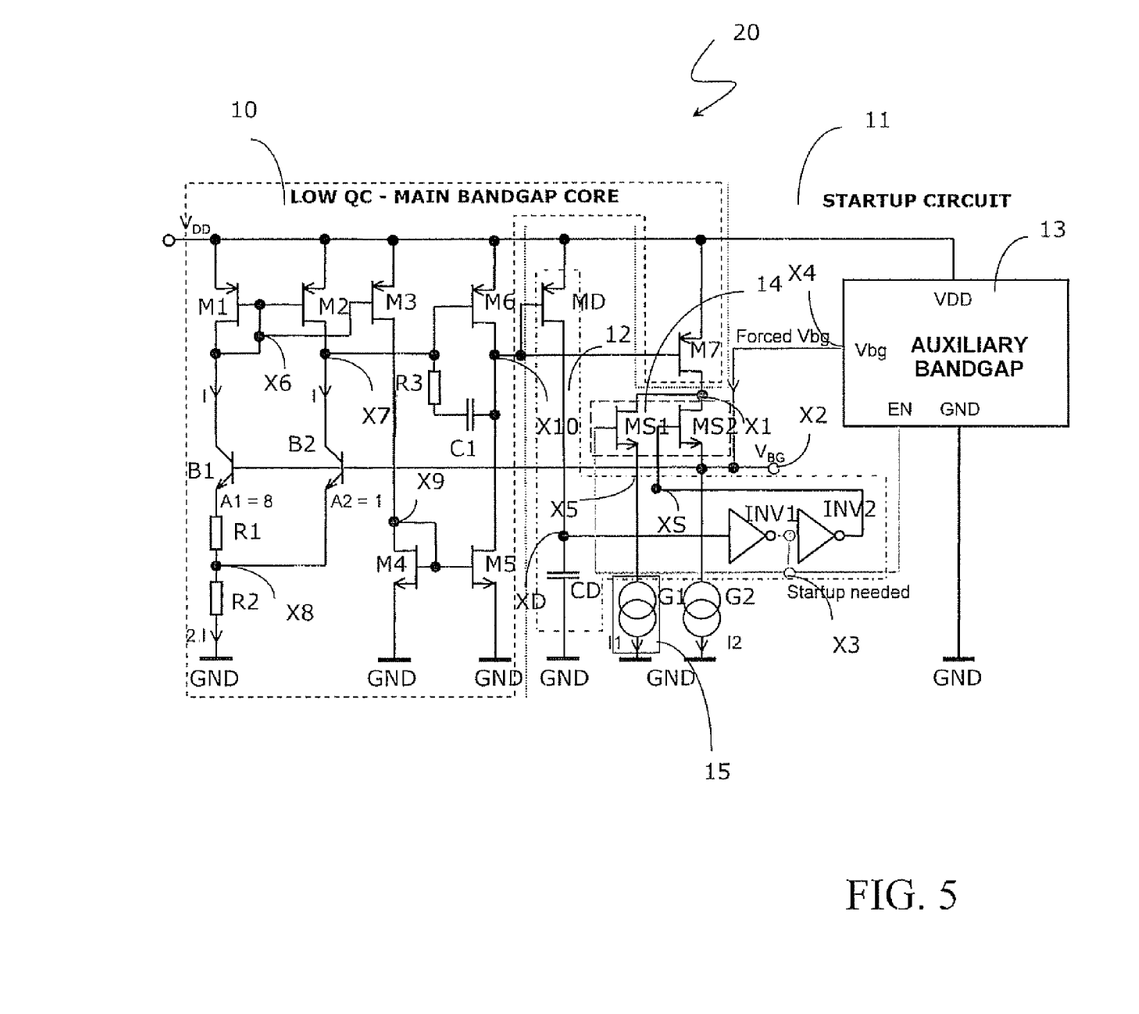
FIG. 5 shows an embodiment of the circuit of FIGS. 3 and 4 in greater detail.

An embodiment of the driven circuit 20, wherein the main circuit 10 is a bandgap reference circuit, of the low Quiescent Current (QC) or low power type, is shown in a more detailed view in FIG. 5.

As illustrated, the driven circuit 20 comprised a low QC main bandgap circuit 10 connected to a startup circuitry 11 in correspondence with a first and a second circuit node, X1 and X2, thereof.

The main bandgap circuit 10 comprises a first and a second bipolar transistor, B1 and B2, as well as a first and a second MOS transistor, M1 and M2, inserted between a first or supply voltage reference VDD and a second or ground voltage reference GND.

Namely, the first MOS transistor M1 is coupled between the supply voltage reference VDD and a first internal circuit node X6, such a first MOS transistor M1 being diode-connected, i.e., has a gate terminal and a conduction terminal, in particular a drain terminal being the first MOS transistor M1 a PMOS transistor in the example shown in FIG. 5, connected to each other and to the first internal circuit node X6.

Moreover, the second MOS transistor M2 is coupled between the supply voltage reference VDD and a second internal circuit node X7 and has its gate terminal connected to the gate terminal of the first MOS transistor, the second MOS transistor being also a PMOS transistor in the example shown in FIG. 5, the drain terminal thereof being connected to the second internal circuit node X7.

Furthermore, the first bipolar transistor B1 is coupled between the first internal circuit node X6 and a voltage divider comprising a first and a second resistor, R1 and R2, inserted in series to each other between the emitter terminal of the first bipolar transistor B1 and ground GND and interconnected in correspondence of a third internal circuit node X8. The second bipolar transistor B2 is in turn coupled between the second internal circuit node X7 and the third internal circuit node X8 and has its base terminal connected to the base terminal of the first bipolar transistor B1, such common base terminals being also connected to the second circuit node X2 of the main circuit 10. The first and second bipolar transistors B1 and B2 are NPN transistors in the example shown in FIG. 5.

The main circuit 10 further comprises a third MOS transistor M3 coupled between the supply voltage reference VDD and a fourth internal circuit node X9, in correspondence of its drain terminal being the third MOS transistor M3 a PMOS transistor in the example shown in FIG. 5, and has its gate terminal connected to the first internal circuit node X6. A fourth MOS transistor M4 is connected between the fourth internal circuit node X9 and ground GND and has its gate terminal connected to a conduction terminal, in particular a drain terminal thereof being the fourth MOS transistor M4 an NMOS transistor in the example shown in FIG. 5.

The main circuit 10 also comprises a fifth and a sixth MOS transistor, M5 and M6. In particular, the sixth MOS transistor M6 is coupled between the supply voltage reference VDD and a fifth internal circuit node X10, in correspondence of its drain terminal being the sixth MOS transistor M6 a PMOS transistor in the example shown in FIG. 5, and has a gate terminal connected to the second internal circuit node X7. Also, the fifth MOS transistor M5 is coupled between the fifth internal circuit node X10 and ground GND, in correspondence of its drain terminal being the fifth MOS transistor M5 an NMOS transistor in the example shown in FIG. 5, and has a gate terminal connected to the gate terminal of the fourth MOS transistor M4.

Furthermore, the main circuit 10 comprises a third resistor R3 and a first condenser C1 inserted, in series to each other, between the second internal circuit node X7 and the fifth internal circuit node X10.

The main circuit 10 comprises a seventh MOS transistor M7 which is coupled between the supply voltage reference VDD and the first circuit node X1, in correspondence of its drain terminal being the seventh MOS transistor M7 a PMOS transistor in the example shown in FIG. 5, and has a gate terminal connected to the fifth internal circuit node X10. As illustrated, the seventh MOS transistor M7 is the output driver transistor of the main circuit 10.

The main circuit 10 shown in FIG. 5 is a low QC bandgap reference circuit having the resistors R1 and R2 a very high resistance value.

The driven circuit 20 also comprises a startup circuitry 11 connected to the first and second circuit node, X1 and X2, of the main circuit 10 and able to provide a correct output voltage value, namely a forced bandgap voltage value Forced Vbg, also during the startup phase of the main circuit 10.

As illustrated the startup circuitry 11 comprises a startup detection block 12 inserted between the supply voltage reference VDD and ground GND and in turn including a detection transistor MD which is coupled between the supply voltage reference VDD and a detection condenser CD, in turn connected to ground GND. In particular, in the example shown in FIG. 5, the detection transistor MD is a PMOS transistor and has a source terminal connected to the supply voltage reference VDD, a drain terminal connected to the detection condenser CD in correspondence with a detection node XD and a gate terminal connected to the fifth internal circuit node X10 of the main circuit 10.

The startup detection block 12 also comprises a first and second inverter, INV1 and INV2, inserted, in series to each other, between the detection node XD and a switching internal circuit node XS and they are interconnected in correspondence with the third circuit node X3.

Moreover, the startup circuitry 11 comprises a switching block 14, inserted between the first and second circuit nodes X1 and X2 and in turn including a first switching transistor MS1 being coupled, in series with a first current generator G1, between the first circuit node X1 and ground GND as well as second switching transistor MS2 being also coupled, in series with a second current generator G2, between the first circuit node X1 and ground GND. The first current generator G1 acts as the compensation feedback impedance 15 while the second current generator G2 is an equivalent input impedance of additional circuitry that can be connected to the terminal OUT. For example, the circuit 20 can be connected to a resistor divider to obtain an output voltage reference which is lower than the bandgap voltage VBG. Moreover, the first current generator G1 is a compensation impedance which is ideally the sum of the input impedance of the additional circuitry (G2) and the input impedance of the node Tfb (impedance of the base terminals of the bipolar transistors B1 and B2). In particular, in the example shown in FIG. 5, the first switching transistor MS1 is an NMOS transistor and has a drain terminal connected to the first circuit node X1, a source terminal connected to the first current generator G1 in correspondence with the fifth circuit node X5 of the main circuit 10 and a gate terminal connected to the third circuit node X3 of the startup detection block 12. Moreover, in the example shown in FIG. 5, the second switching transistor MS2 is an NMOS transistor and has a drain terminal connected to the first circuit node X1, a source terminal connected to the second current generator G2 as well as to the second circuit node X2 and a gate terminal connected to the switching internal circuit node XS and thus to the second inverter INV2 of the startup detection block 12.

The startup circuitry 11 comprises an auxiliary circuit 13, in particular an auxiliary bandgap reference circuit, coupled between the supply voltage reference VDD and ground GND and having a fourth circuit node X4 connected to the second circuit node X2 and receiving therefrom the forced output voltage value, in particular the forced bandgap voltage value, Forced Vbg, and well as an enabling terminal connected to the third circuit node X3 and thus to the startup detection block 12. In this way the third circuit node X3 provides to the auxiliary circuit 13 the enabling signal EN.

It should be emphasized that the startup circuitry 11 is used to ensure a proper initialization of the main bandgap circuit 10, the sensing part thereof, i.e., the startup detection block 12, being designed to sense and process a main bandgap operational point, namely the current flowing through the output driver transistor M7 of the main circuit 10.

Moreover, the switching block 14 comprising the first and second switching transistors, MS1 and MS2, controls feedback loop FB of the main circuit 10 and the reconnection of its compensation feedback impedance 15.

The auxiliary bandgap circuit which may be a high power copy of the low power main bandgap circuit 10, as previously explained.

In particular, the auxiliary circuit 13 may be based on a same topology and on same types of components as the main bandgap circuit 10, but it has a quiescent current much higher than the one of the main circuit 10, its internal resistors having low resistance values. Therefore, the forced output voltage value, Forced Vbg, from the auxiliary bandgap circuit 13 is highly correlated with the output voltage value Vbg of the main bandgap circuit 10.

When a startup compensation of the main bandgap circuit 10 is needed, i.e., the output of the first inverter INV1 of the startup detection block 12 is high and the output of the second inverter INV2 is low, the second switching transistor MS2 disconnects the output driver transistor M7 from the second circuit node X2 so that the feedback loop FB of the main bandgap circuit 10 is broken, i.e., open. Moreover, the first switching transistor MS1 connects the output driver transistor M7 to the compensation feedback impedance 15. At the same time, the auxiliary bandgap circuit 13 is enabled and its output voltage value equal to the forced bandgap voltage value, Forced Vbg, is forced into the open loop main bandgap circuit 10.

On the contrary, when the startup detection block 12 detects a correct biasing of the main bandgap circuit 10, in particular when the output of the first inverter INV1 goes low and the output of the second inverter INV2 goes high, the second switching transistor MS2 becomes conductive thus closing i.e., restoring the feedback loop FB of the main bandgap circuit 10. At the same time, the first switching transistor MS1 disconnects the compensation feedback impedance 15 and the auxiliary bandgap circuit 13 is disabled. In this way, the startup circuitry 11 is not influencing the main circuit 10.

It should be remarked that also the auxiliary circuit 13 may be provided with a startup circuitry, which may be however realized according to any known solution, being the auxiliary circuit 13 a relatively high power circuit and the known circuitries able to provide such a startup in a very short time.

Figure 6:
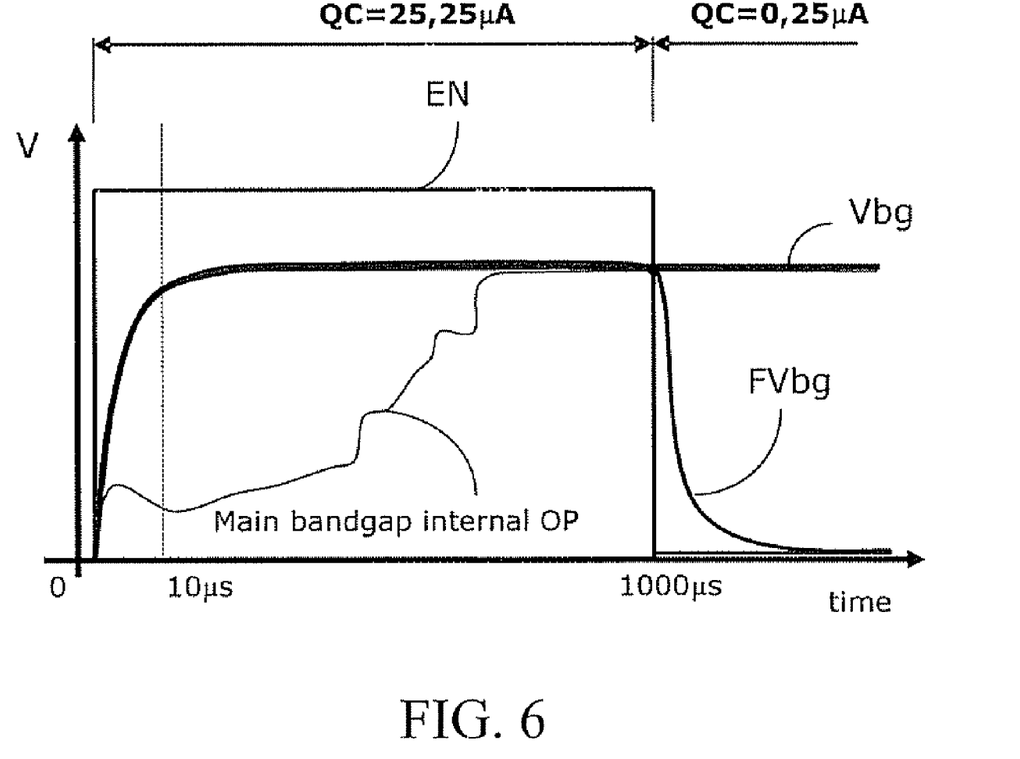
FIG. 6 schematically shows the pattern of startup transients of the circuit of FIG. 5.

A transient behavior of the driven circuit 20 is shown in FIG. 6. In particular, for the simulation of the driven circuit 20 according to the embodiment as shown in FIG. 5, the turn on time of the auxiliary bandgap circuit 13 has been chosen at approximately 10 us and its quiescent current (QC) equal to 25 uA, the quiescent current of the main bandgap circuit 10 being equal is 0.25 uA.

The output bandgap voltage Vbg has a correct value also during the startup phase of the main bandgap circuit 10 wherein its operational point OP is varying as shown in the figure.

It is thus remarked that an embodiment of the present disclosure solves startup problems of circuits such as the bandgap circuits, in particular of the ultra low quiescent current type by using a higher quiescent current auxiliary circuit just for the startup phase of a main circuit and force the required operational point from the auxiliary high current circuit into the main circuit.

Moreover, after the startup phase, when the main circuit is correctly started, the auxiliary circuit may be disabled and the quiescent current drops down to a desired level. In this way the startup of the main circuit is reliable and safe, outputs are ready and available practically immediately and the quiescent current after the startup phase is not affected by the presence of the auxiliary circuit.

Other advantages of embodiments may include:
- the driven circuit 20 has a very fast and low spreading turn on time;
- the output signal Vout is correctly available even before the main circuit starts;
- the startup circuitry 11 ensures a correct biasing of all the components of the main circuit during its startup phase;
- the driven circuit 20 shows minimal transients when the startup phase of the main circuit 10 finishes;
- a more reliable startup (i.e., having a low probability that the main circuit will fall back to the wrong zero state because of the heavy transients as according to the prior art solutions) is obtained;
- a monotonic startup may be obtained, having no overshoots, no local extremes or glitches which are usual in low power circuits, the startup curve being mostly given by the auxiliary circuit during the startup phase;
- embodiments of the proposed startup circuitry 11 are suitable for ultra low-power circuits; and
- the driven circuit 20 comprising such a startup circuitry 11 does not need to use additional power supply after the startup phase.

In essence, an embodiment of the disclosure allows to obtain turn-on time of a main circuit which is not limited by the amount of the quiescent current biasing the circuit components, thus breaking the limits that currently tie the designers when try to create a fast turn on, low quiescent bias circuit. A fast and reliable startup of the ultra low power (low quiescent current) circuits may be obtained.

This disclosure particularly relates to the field of the analog circuit design and namely to the design of internal bias structures, self biased circuits or, generally, circuits included feedbacks, in particular low-power circuits, where the startup phases of the feedback loops are usually very slow and problematic.

Obviously, a technician of the field, aiming at meeting incidental and specific needs, may bring several modifications to the above described circuitry and method, all within the scope of disclosure.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The systems, modules and data structures may also be transmitted as generated data signals (e.g., as part of a carrier wave) on a variety of computer-readable transmission mediums, including wireless-based and wired/cable-based mediums.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
an input node configured to couple to an output of a circuit having a feedback input;
a feedback output node configured to couple to the feedback input of the circuit; and
a startup module configured to detect a startup condition of the circuit, and when a startup condition is detected, break a connection between the output node of the circuit and the feedback node of the circuit and provide a feedback output signal to the feedback node of the circuit.

2. The device of claim 1 wherein when a startup condition is detected the startup module is further configured to couple the feedback output node to an output node of the device.

3. The device of claim 2 wherein when a startup condition is not detected the startup module is configured to couple the output of the circuit to the feedback input of the circuit and to the output node of the device.

4. The device according to claim 2, further comprising an auxiliary circuit which is a functional copy of said circuit and wherein the startup module is configured to couple an output of the auxiliary circuit to the feedback input of the circuit and to the output of the device.

5. The device according to claim 4 wherein the startup module is coupled to a sensing terminal of said circuit and is configured to provide an enabling signal corresponding to a state of said circuit wherein a startup condition is detected.

6. The device according to claim 5 wherein the startup module comprises a switching block which is configured to couple between the output of the circuit and the feedback input of the circuit and is configured to couple to the output of said auxiliary circuit as well to said enabling signal, the switching block being configured to use the enabling signal as a driving signal to break the connection between the output of the circuit and the feedback input of the circuit.

7. The device according to claim 6, further comprising a compensation feedback impedance-, wherein the switching block is configured to couple the output of the circuit to a first reference voltage through the compensation feedback impedance when the startup condition is detected.

8. The device according to claim 7 wherein said switching block comprises a first and a second switch, both driven by said enabling signal, wherein:
said first switch is configured to couple the output of the circuit to the compensation feedback impedance in a first operational state of the circuit, and to coupled the output of the circuit to the feedback input of the circuit in a second operational phase of said circuit, when a feedback loop of the circuit is to be closed; and
said second switch is configured to coupled between the output of the auxiliary circuit the feedback input of the circuit and is closed in said first operational state of the main circuit, and is open in said second operational phase of said circuit, when said feedback loop is to be closed.

9. The device according to claim 8 wherein said auxiliary circuit is disconnected from a second voltage reference, in said second operational phase of said circuit, when said feedback loop is closed.

10. The device according to claim 9 wherein said circuit comprises at least an output driver transistor which is coupled between said second voltage reference and said output of the circuit and has a gate terminal connected to an internal circuit node of the circuit and wherein the startup module is coupled between said first and second voltage references and in turn includes at least a detection transistor which is coupled between said second voltage reference and a detection condenser, in turn connected to said first voltage reference interconnected in correspondence with a detection node, said detection transistor having a gate terminal connected to said internal circuit node.

11. The device according to claim 10 wherein said startup module further comprises a first and a second inverter which are inserted, in series to each other, between said detection node and a switching internal circuit node and configured to provide the enabling signal at an interconnection between the first and second inverters.

12. The device according to claim 11 wherein the switching block includes at least a first switching transistor being coupled, in series with a first current generator, between said output of the circuit and said first voltage reference as well as a second switching transistor being also coupled in series with a second current generator, between said output of the circuit and said first voltage reference, said first current generator acting as said compensation feedback impedance.

13. The device according to claim 12 wherein said first switching transistor has a gate terminal connected to said enable signal and said second switching transistor has a gate terminal connected to said switching internal circuit node and thus to said second inverter of said startup detection block.

14. The device according to claim 4 wherein said circuit and said auxiliary circuit are coupled between first and second voltage references and the auxiliary circuit is based on a same topology and on same types of components as said circuit.

15. The device according to claim 4 wherein said circuit is a low power and low quiescent current bandgap main circuit and said auxiliary circuit is a high power copy thereof having an output voltage value being highly correlated to said output of the bandgap main circuit and a quiescent current much higher than the quiescent current of said bandgap main circuit.

16. A method, comprising:
detecting a startup state of a main circuit;
generating a startup output voltage value corresponding to a voltage value of said main circuit at the end of said startup state;
opening a feedback loop of said main circuit;
applying said startup output voltage value to an output terminal until an end of said startup state of said main circuit; and
disconnecting said startup output voltage value at the end of said startup state of said main circuit.

17. The method according to claim 16 wherein said step of opening said feedback loop of said main circuit is performed by startup circuitry which has a first circuit node connected to an output terminal of said main circuit and a second circuit node connected to a feedback terminal of the main circuit and the startup circuitry comprises at least a switching block connected to an auxiliary circuit, which is a copy of said main circuit not suffering from a same startup variations as the main circuit, and to a startup detection block providing an enabling signal corresponding to a state of said main circuit wherein a startup is needed, said switching block configured to open said feedback loop.

18. The method according to claim 17 wherein said step of generating said startup output voltage value is performed by said auxiliary circuit.

19. The method according to claim 17, further comprising a step of detecting a begin and the end of said startup state of said main circuit.

20. The method according to claim 19 wherein said step of detecting is performed by said startup detection block.

21. The method according to claim 16 wherein said step of disconnecting is performed by a switching block.

22. A system, comprising:
a circuit configured to generate an output signal provided to an output node and having a feedback loop;
means for detecting a startup state of the circuit;
means for responding to detection of a startup state by interrupting the feedback loop and coupling an alternative output signal to the output node.

23. The system of claim 22, further comprising means for generating the alternative output signal.

24. The system of claim 23 wherein the circuit is configured to operate at a first power level and the means for generating the alternative output signal is a circuit having a similar structure as the circuit configured to generate the output signal and is configured to operate at a second power level higher than the first power level.

25. The system of claim 23 wherein the circuit configured to generate the output signal is a low power and low quiescent current bandgap main circuit and the means for generating the alternative output signal is a higher power copy thereof configured to generate a stable alternative output signal in response to detection of a startup faster than the current bandgap main circuit.

26. An integrated circuit, comprising:
 a first module configured to generate a first output signal and having a feedback input;
 a second module configured to generate a second output signal; and
 a startup module configured to:
  determine when the first module is in a startup mode;
  when the first module is in the startup mode,
   couple the second output signal to the feedback input of the first module; and
   decouple the first output signal from the feedback input of the first module; and
  when the first module is not in the startup mode, couple the first output signal to the feedback input of the first module.

27. The integrated circuit of claim 26 wherein the startup module is configured to:
 when the first module is in the startup mode, enable the second module and couple the second output signal to a node of the integrated circuit; and
 when the first module is not in the startup mode, disable the second module and couple the first output signal to the node of the integrated circuit.

28. The integrated circuit of claim 27 wherein the first module has a first configuration of components and is configured to draw power at a first power level and the second module has the first configuration of components and is configured to draw power at a second power level higher than the first power level.

* * * * *